(12) United States Patent
Yano

(10) Patent No.: US 7,777,453 B2
(45) Date of Patent: Aug. 17, 2010

(54) CAR POWER SOURCE APPARATUS HAVING AN OVER-CHARGE AND OVER-DISCHARGE PROTECTION CIRCUIT WITH AUTOMATIC SELF-TEST FUNCTION

(75) Inventor: Junya Yano, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 191 days.

(21) Appl. No.: 11/979,793

(22) Filed: Nov. 8, 2007

(65) Prior Publication Data

US 2008/0111556 A1 May 15, 2008

(30) Foreign Application Priority Data

Nov. 10, 2006 (JP) .............................. 2006-305756

(51) Int. Cl.
*H02J 7/00* (2006.01)
*H02H 7/06* (2006.01)
*H02H 7/09* (2006.01)
*G01N 27/416* (2006.01)

(52) U.S. Cl. ........................ 320/134; 320/136; 320/132; 361/21; 361/33; 324/433

(58) Field of Classification Search ................. 324/433, 324/428; 320/134

See application file for complete search history.

(56) References Cited

U.S. PATENT DOCUMENTS 6,268,710 B1 * 7/2001 Koga ........................... 320/116

2003/0015995 A1 * 1/2003 Tamura et al. .............. 320/162
2005/0093516 A1 * 5/2005 Beasley ...................... 320/134
2005/0248351 A1 * 11/2005 Graf ............................ 324/433
2009/0128158 A1 * 5/2009 Kawai ......................... 324/433

FOREIGN PATENT DOCUMENTS

JP 2001-25173 1/2001
JP 2007033108 A * 2/2007

* cited by examiner

*Primary Examiner*—Edward Tso
*Assistant Examiner*—Ahmed Omar
(74) *Attorney, Agent, or Firm*—Wenderoth, Lind & Ponack, L.L.P.

(57) ABSTRACT

A car power source apparatus includes a battery array that has a plurality of battery units connected in series, a battery over-charge and over-discharge detection circuit, selection switches that sequentially input battery unit voltages to the over-charge and over-discharge detection circuit, a reference voltage circuit that inputs reference voltages to the over-charge and over-discharge detection circuit, and a control circuit that controls selection switches and the reference voltage circuit. The control circuit controls the selection switches to input battery unit voltages to the over-charge and over-discharge detection circuit to determine over-charge and over-discharge. Further, the control circuit controls selection switches not to input battery unit voltages to the over-charge and over-discharge detection circuit, but controls input of reference voltages to the over-charge and over-discharge detection circuit from the reference voltage circuit to confirm the operating condition of the over-charge and over-discharge detection circuit.

15 Claims, 3 Drawing Sheets

CAR POWER SOURCE APPARATUS HAVING AN OVER-CHARGE AND OVER-DISCHARGE PROTECTION CIRCUIT WITH AUTOMATIC SELF-TEST FUNCTION

BACKGROUND OF THE INVENTION

1. Field of the Invention

This invention relates to a car power source apparatus with a plurality of battery units connected in series, and to a car power source apparatus provided with a circuit to detect over-charge and over-discharge of each battery unit.

2. Description of the Related Art

For a car power source apparatus with a plurality of battery units connected in series, wherein a battery unit is one or a plurality of rechargeable batteries connected in series, it is important to charge and discharge battery units while protecting them by detecting over-charge and over-discharge for each battery unit. This is because over-charge or over-discharge causes significant battery unit degradation. There are two types of these power source apparatus. One type is provided with a protection circuit that monitors a plurality of battery units in total, and another type is provided with circuitry that detects over-charge and over-discharge independently for each battery unit. The type that monitors battery units in total can have a simple detection circuit. However, not all battery units are over-charged or over-discharged in the same manner. A battery unit with reduced charge capacity is more easily over-charged or over-discharged. A battery unit in this state, which has had its charge capacity reduced, undergoes a rapid drop in performance when over-charged or over-discharged. As a result this type of power source apparatus has the drawback that if any battery unit degrades and its performance drops, that battery unit's performance will degrade abruptly.

A power source apparatus provided with detection circuitry that detect over-charge and over-discharge independently for each battery unit is cited in Japanese Patent Application Disclosure 2001-25173. The power source apparatus cited in this disclosure can detect over-charge and over-discharge for each battery unit. Consequently, this power source apparatus can prevent over-charge and over-discharge of all battery units, improve safety, and markedly increase battery unit life.

SUMMARY OF THE INVENTION

However, the power source apparatus disclosed in the patent application above has a protection circuit with a complex circuit structure that increases manufacturing cost. In particular, in a power source apparatus with many battery units, it is necessary to provide the same number of detection circuits as battery units. This makes detection circuitry extremely complex. Further, for redundancy, two over-charge and over-discharge detection circuits are provided for each battery unit to allow detection of battery unit over-charge and over-discharge in the event one detection circuit fails. The main detection circuits are battery state detection circuits that compute remaining capacity in addition to detecting over-charge and over-discharge for each battery unit. Further, special-purpose detection circuits that detect only over-charge and over-discharge are provided to allow detection of battery over-charge and over-discharge even if a main detection circuit fails. Since the special-purpose detection circuits are only used in the event of main detection circuit failure, they are rarely used in practice. Regardless, the same number of special-purpose detection circuits is provided as the large number of battery units. This establishes a circuit structure that provides back up in case main detection circuitry fails. Even though the special-purpose detection circuits are almost never used, they are required for reliable operation in case a main detection circuit fails.

However, in prior art car power source apparatus, circuitry to determine failure of the special-purpose detection circuits is not provided, and failure of those circuits cannot be determined. Consequently, if a main detection circuit fails and over-charge and over-discharge are judged by a special-purpose detection circuit, there is no way to determine if that special-purpose detection circuit is operating properly or not. This drawback can be eliminated by providing circuitry to determine failure of the special-purpose detection circuits. However, providing the same number of failure detection circuits as the extremely large number of special-purpose detection circuits, which is the same as the number of battery units, adds further complexity to the circuit structure. Therefore, adoption of this circuitry is practically impossible.

The present invention was developed to further resolve these drawbacks. Thus it is an important object of the present invention to provide a car power source apparatus, which has an over-charge and over-discharge detection circuit that can reliably determine over-charge and over-discharge of all battery units, and can determine failure of that detection circuit while keeping over-charge and over-discharge detection circuit structure extremely simple.

The car power source apparatus of the present invention, which is provided with an over-charge and over-discharge detection circuit, has the following structure to realize the object described above. The car power source apparatus is provided with a battery array 1 that has a plurality of battery units 10 connected in series via connection nodes 11, an over-charge and over-discharge detection circuit 3 that detects voltage, over-charge, and over-discharge of the battery units 10 that make up the battery array 1, selection switches 4 that sequentially input battery unit 10 connection node 11 voltages to the over-charge and over-discharge detection circuit 3, a reference voltage circuit 5 that inputs reference voltages to the over-charge and over-discharge detection circuit 3 when selection switches 4 are not inputting connection node 11 voltages, and a control circuit 6 that controls selection switches 4 on and off and controls input of reference voltages from the reference voltage circuit 5 to the over-charge and over-discharge detection circuit 3.

The control circuit 6 controls selection switches 4 to input connection node 11 voltages to the over-charge and over-discharge detection circuit 3 to determine battery unit 10 over-charge and over-discharge. In addition, the control circuit 6 controls selection switches 4 to a state that does not input connection node 11 voltages to the over-charge and over-discharge detection circuit 3. In this state, the control circuit 6 controls the input of reference voltages from the reference voltage circuit 5 to the over-charge and over-discharge detection circuit 3 to confirm proper operation of the over-charge and over-discharge detection circuit 3.

The car power source apparatus described above has the characteristic that over-charge and over-discharge of all battery units can be reliably determined with an extremely simple over-charge and over-discharge detection circuit structure. Furthermore, failure of this detection circuit can also be determined. This is because the car power source apparatus described above is provided with selection switches between the battery units and the over-charge and over-discharge detection circuit, and because detection circuit failure can be determined by inputting reference voltages from the reference voltage circuit to the over-charge and over-discharge detection circuit when selection switches are off. Since the over-charge and over-discharge detection circuit connects to battery unit connection nodes via the selection switches, over-charge and over-discharge of all battery units can be detected with a single detection circuit. Further, since reference voltages are input to determine failure of this single detection circuit, battery unit over-charge and over-discharge can be detected while confirming proper operation of that detection circuit.

In addition, the power source apparatus of the present invention can have a battery state detection circuit 2 connected to the output-side of the selection switches 4. The battery state detection circuit 2 determines battery unit 10 over-charge, over-discharge, and remaining capacity. This power source apparatus detects battery unit over-charge and over-discharge with the battery state detection circuit 2. Furthermore, if the battery state detection circuit 2 fails, the power source apparatus detects battery over-charge and over-discharge with the over-charge and over-discharge detection circuit 3, which can be confirmed for proper operation. Consequently, this power source apparatus can determine battery unit 10 over-charge and over-discharge with a very high degree of accuracy.

Further, the power source apparatus of the present invention can be provided with a battery state detection circuit 2 at the output-side of the selection switches 4, and this battery state detection circuit 2 can have a configuration provided with an over-charge and over-discharge detection circuit 3. This power source apparatus can detect failure of the over-charge and over-discharge detection circuit 3 provided for the battery state detection circuit 2.

Still further, the over-charge and over-discharge detection circuit 3 of the power source apparatus of the present invention can be configured with an analog to digital (A/D) converter 8 to convert signals input from the selection switches 4 to digital signals, and a decision circuit 9 to determine over-charge and over-discharge from signals output from the A/D converter 8. This power source apparatus can accurately determine battery unit 10 over-charge and over-discharge with digital processing by the decision circuit 9.

Finally, a battery unit 10 of the power source apparatus of the present invention can be a single rechargeable battery, or it can be a battery block with a plurality of rechargeable batteries connected in series. In a power source apparatus having a single rechargeable battery for each battery unit 10, over-charge and over-discharge of each battery can be accurately determined for all batteries.

The above and further objects of the present invention as well as the features thereof will become more apparent from the following detailed description to be made in conjunction with the accompanying drawings.

DETAILED DESCRIPTION OF THE INVENTION

Figure 1:
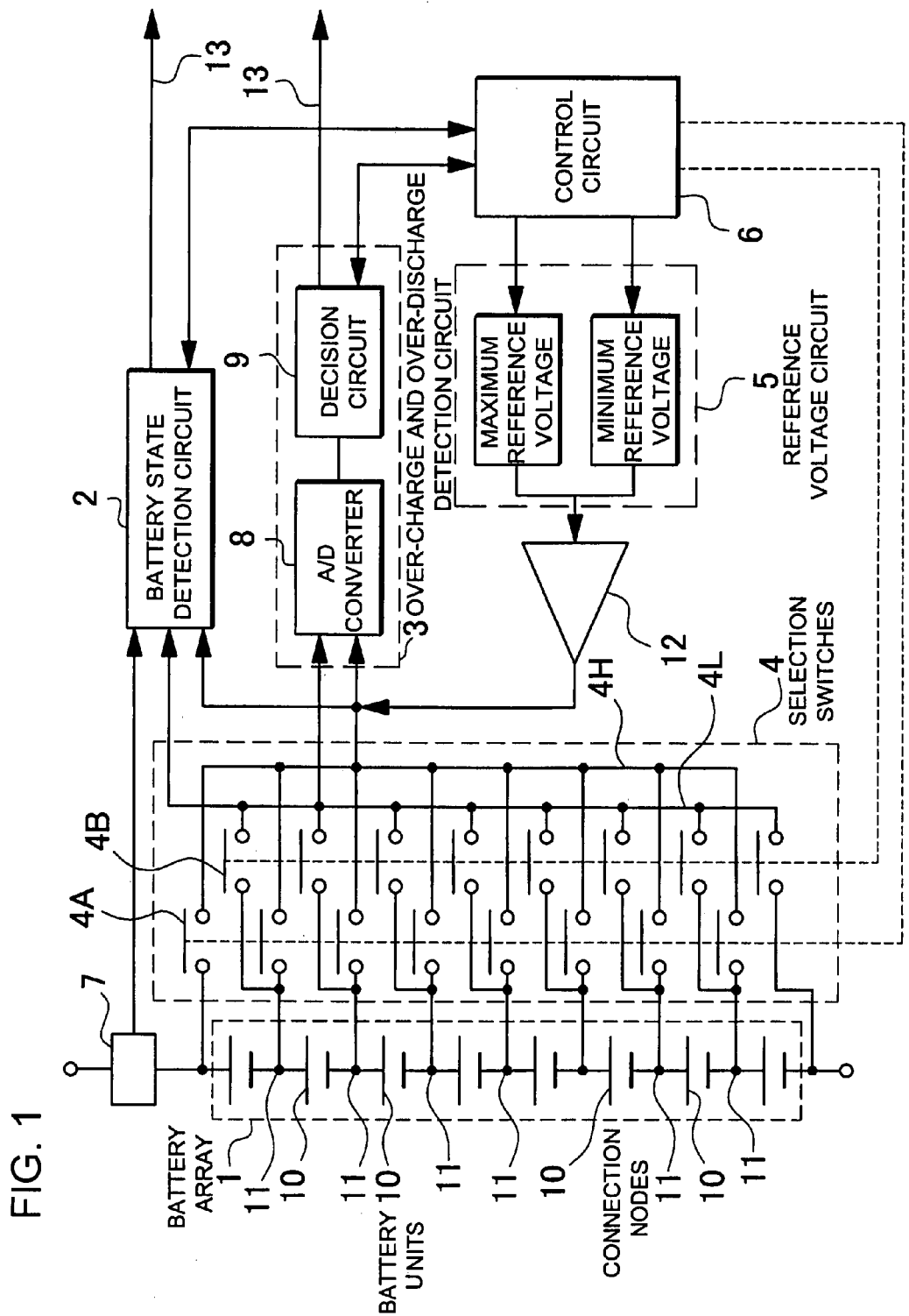
FIG. 1 is a block diagram of an embodiment of the car power source apparatus of the present invention.

The car power source apparatus shown in the block diagram of FIG. 1 is provided with a battery array 1 that has a plurality of battery units 10 connected in series via connection nodes 11; a battery state detection circuit 2 that detects battery voltage and battery state of the battery units 10 that make up the battery array 1; an over-charge and over-discharge detection circuit 3 that further detects voltage, over-charge, and over-discharge of the battery units 10 that make up the battery array 1; selection switches 4 that sequentially input battery unit 10 connection node 11 voltages to the battery state detection circuit 2 and over-charge and over-discharge detection circuit 3; a reference voltage circuit 5 that inputs reference voltages to the over-charge and over-discharge detection circuit 3 when selection switches 4 do not input connection node 11 voltages; and a control circuit 6 that controls selection switches 4 on and off and controls input of reference voltages from the reference voltage circuit 5 to the over-charge and over-discharge detection circuit 3.

Each battery unit 10 that makes up the battery array 1 is a single rechargeable battery. However, a battery unit may also be a plurality of rechargeable batteries connected in series. A battery unit 10 that is a single rechargeable battery has a lithium ion battery as its rechargeable battery. However, any type of rechargeable battery, such as a nickel hydride battery or nickel cadmium battery can be used as the rechargeable battery. A battery unit with nickel hydride batteries or nickel cadmium batteries is a plurality of those rechargeable batteries connected in series. A battery unit, which has a plurality of rechargeable batteries connected in series, connects 3 to 6 rechargeable batteries in series.

The battery state detection circuit 2 detects battery unit 10 over-charge and over-discharge from battery unit 10 voltage input from the selection switches 4. A positive-side selection switch 4A and negative-side selection switch 4B connected to connection nodes 11, 11 located above and below a selected battery unit 10 are turned on. The voltage difference across that battery unit 10 is input to the battery state detection circuit 2 and over-charge and over-discharge detection circuit 3 via positive-side wiring 4H and negative-side wiring 4L. By repeatedly switching selection switches 4 to sequentially input the connection node 11 voltage difference for each battery unit 10, the battery state detection circuit 2 detects the voltage of each battery unit 10. The detected voltage of each battery unit 10 is compared with an over-charge voltage and an over-discharge voltage to determine battery unit 10 over-charge or over-discharge. For example, the over-charge voltage is 4.2V and the over-discharge voltage is 2.6V for a power source apparatus having a single lithium ion rechargeable battery as a battery unit 1. In this power source apparatus, over-charge is judged for battery unit 10 voltage greater than 4.2V, which is the over-charge voltage, and over-discharge is judged for battery unit 10 voltage less than 2.6V.

This battery state detection circuit 2 not only detects battery unit 10 over-charge and over-discharge, but also computes quantities such as remaining battery capacity. A battery state detection circuit 2 that computes remaining battery capacity is provided with a current detection circuit 7 that measures battery array 1 charging and discharging current. This battery state detection circuit 2 computes battery array 1 remaining battery capacity from the integrated value of charging and discharging current. As charging and discharging is repeated, error in the computed remaining battery capacity accumulates. To correct this error, battery unit 10 voltage is used to calibrate remaining capacity. For example, when voltage of a battery unit 10 reaches the full charge voltage, remaining capacity from integration of the current is corrected to 100%. Similarly, when a battery voltage drops to the complete discharge voltage, remaining capacity from integration of the current is corrected to 0%. This battery state detection circuit 2 detects battery unit 10 over-charge and over-discharge, and computes remaining capacity with a fixed periodicity during car operation, that is when the ignition switch is on. These results are sent to car-side systems via communication lines 13. If the battery state detection circuit 2 fails, battery unit 10 over-charge and over-discharge are detected by the over-charge and over-discharge detection circuit 3 described below. Battery state detection circuit 2 failure is determined from the signals output from that circuit. Specifically, if the battery state detection circuit 2 fails, no signals detecting battery unit 10 over-charge or over-discharge are output, and further, no signals indicating remaining battery capacity are output. If these signals are not output, the over-charge and over-discharge detection circuit 3 detects battery unit 10 over-charge and over-discharge. In the battery state detection circuit 2, over-charge voltage is set to 4.2V, for example, and over-discharge voltage is set to 2.6V, for example. Consequently, the battery state detection circuit 2 judges a battery unit 10 with voltage at or above 4.2V as over-charged and a battery unit 10 with voltage at or below 2.6V as over-discharged.

The over-charge and over-discharge detection circuit 3 of FIG. 1 is provided with an A/D converter 8 to convert signals input from the selection switches 4 to digital signals, and a decision circuit 9 to determine battery over-charge and over-discharge from the signals output from the A/D converter 8. The decision circuit 9 measures battery unit 10 voltage from the voltage across battery unit 10 connection nodes 11, which is input from the A/D converter 8. In the same manner as the battery state detection circuit 2, the decision circuit 9 compares the measured voltage with an over-charge voltage and an over-discharge voltage to determine battery unit 10 over-charge and over-discharge. To judge battery unit 10 over-charge and over-discharge, the decision circuit 9 stores the over-charge voltage and over-discharge voltage in memory. The over-charge voltage and over-discharge voltage stored in memory are compared with battery unit 10 voltage to determine battery unit 10 over-charge or over-discharge. For example, the over-charge voltage and over-discharge voltage stored in memory can be the same as for the battery state detection circuit 2 at 4.2V and 2.6V respectively. Therefore, the decision circuit 9 judges a battery unit 10 with voltage at or above 4.2V as over-charged and a battery unit 10 with voltage at or below 2.6V as over-discharged. However, it is possible to store over-charge and over-discharge voltages as decision values in memory that represent a further progressed state of over-charge and over-discharge compared with the voltage values of the battery state detection circuit 2. For example, 4.3V can be stored in memory as the over-charge voltage, and 2.3V can be stored as the over-discharge voltage in this over-charge and over-discharge detection circuit 3. Here, the over-charge and over-discharge detection circuit 3 is operated as a protection circuit in case of battery state detection circuit 2 failure.

The selection switches 4 are controlled by the control circuit 6 to sequentially select connection nodes 11 for each battery unit 10 with a given periodicity, and output that voltage to the battery state detection circuit 2 and the over-charge and over-discharge detection circuit 3. At a given time, a given pair of selection switches 4A, 4B are on while all other selection switches 4 are off. This outputs the voltage across the selected connection nodes 11, 11 to the battery state detection circuit 2 and over-charge and over-discharge detection circuit 3.

The reference voltage circuit 5 is controlled by the control circuit 6 to determine failure of the over-charge and over-discharge detection circuit 3. At this time, the reference voltage circuit 5 outputs a maximum reference voltage greater than the over-charge voltage for detection of battery unit 10 over-charge (greater than 4.2V), and a minimum reference voltage less than the over-discharge voltage (less than 2.6V). The reference voltage circuit 5 of the figures has a buffer amp 12 connected to its output-side. Consequently, the maximum reference voltage and minimum reference voltage are input to the over-charge and over-discharge detection circuit 3 from the reference voltage circuit 5 via the buffer amp 12.

The control circuit 6 controls selection switches 4, the over-charge and over-discharge detection circuit 3, and the reference voltage circuit 5 to determine battery unit 10 over-charge and over-discharge via the over-charge and over-discharge detection circuit 3, and failure of the over-charge and over-discharge detection circuit 3. When the control circuit 6 judges failure of the over-charge and over-discharge detection circuit 3, all selection switches 4 are turned off, and the maximum reference voltage and minimum reference voltage are input in that order to the over-charge and over-discharge detection circuit 3 from the reference voltage circuit 5. When the maximum reference voltage is input from the reference voltage circuit 5, a properly operating over-charge and over-discharge detection circuit 3 issues an over-charge signal. Similarly, when the minimum reference voltage is input, it issues an over-discharge signal. Consequently, if the over-charge and over-discharge detection circuit 3 issues an over-charge signal when the maximum reference voltage is input and issues an over-discharge signal when the minimum reference voltage is input, over-charge and over-discharge detection circuit 3 operation can be judged as proper. The control circuit 6 determines over-charge and over-discharge detection circuit 3 proper operation or failure from the over-charge and over-discharge signals it outputs.

Figure 2:
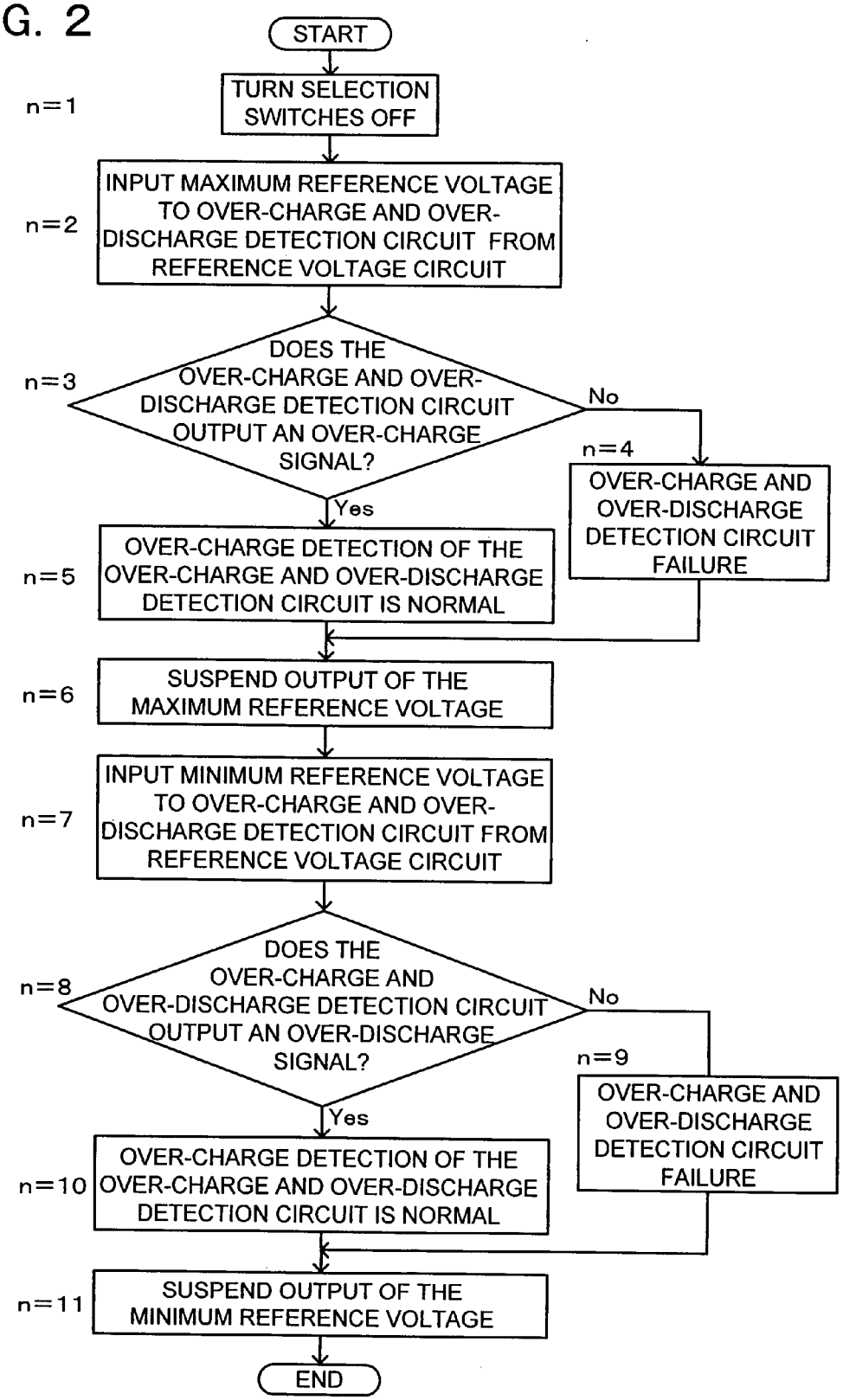
FIG. 2 is a flow-chart for determining failure of the over-charge and over-discharge detection circuit in the car power source apparatus shown in FIG. 1.

The control circuit 6 described above determines over-charge and over-discharge detection circuit 3 failure by the following steps shown in FIG. 2.

[Step n=1]
Turn off selection switches 4 to disconnect the over-charge and over-discharge detection circuit 3 from connection nodes 11. That is to say, do not input connection node 11 voltages to the over-charge and over-discharge detection circuit 3.

[Step n=2]
Control the reference voltage circuit 5 to input the maximum reference voltage to the over-charge and over-discharge detection circuit 3.

[Steps n=3-5]
Determine if an over-charge signal is output from the over-charge and over-discharge detection circuit 3 when the maximum reference voltage is input to the over-charge and over-discharge detection circuit 3. If no over-charge signal is output, failure is judged. If an over-charge signal is output, proper detection of over-charge is judged.

[Step n=6]
The reference voltage circuit 5 suspends output of the maximum reference voltage.

[Step n=7]
Control the reference voltage circuit 5 to input the minimum reference voltage to the over-charge and over-discharge detection circuit 3.

[Steps n=8-10]
Determine if an over-discharge signal is output from the over-charge and over-discharge detection circuit 3 when the minimum reference voltage is input to the over-charge and over-discharge detection circuit 3. If no over-discharge signal is output, failure is judged. If an over-discharge signal is output, proper detection of over-discharge is judged.

[Step n=11]

The reference voltage circuit 5 suspends output of the minimum reference voltage.

Figure 3:
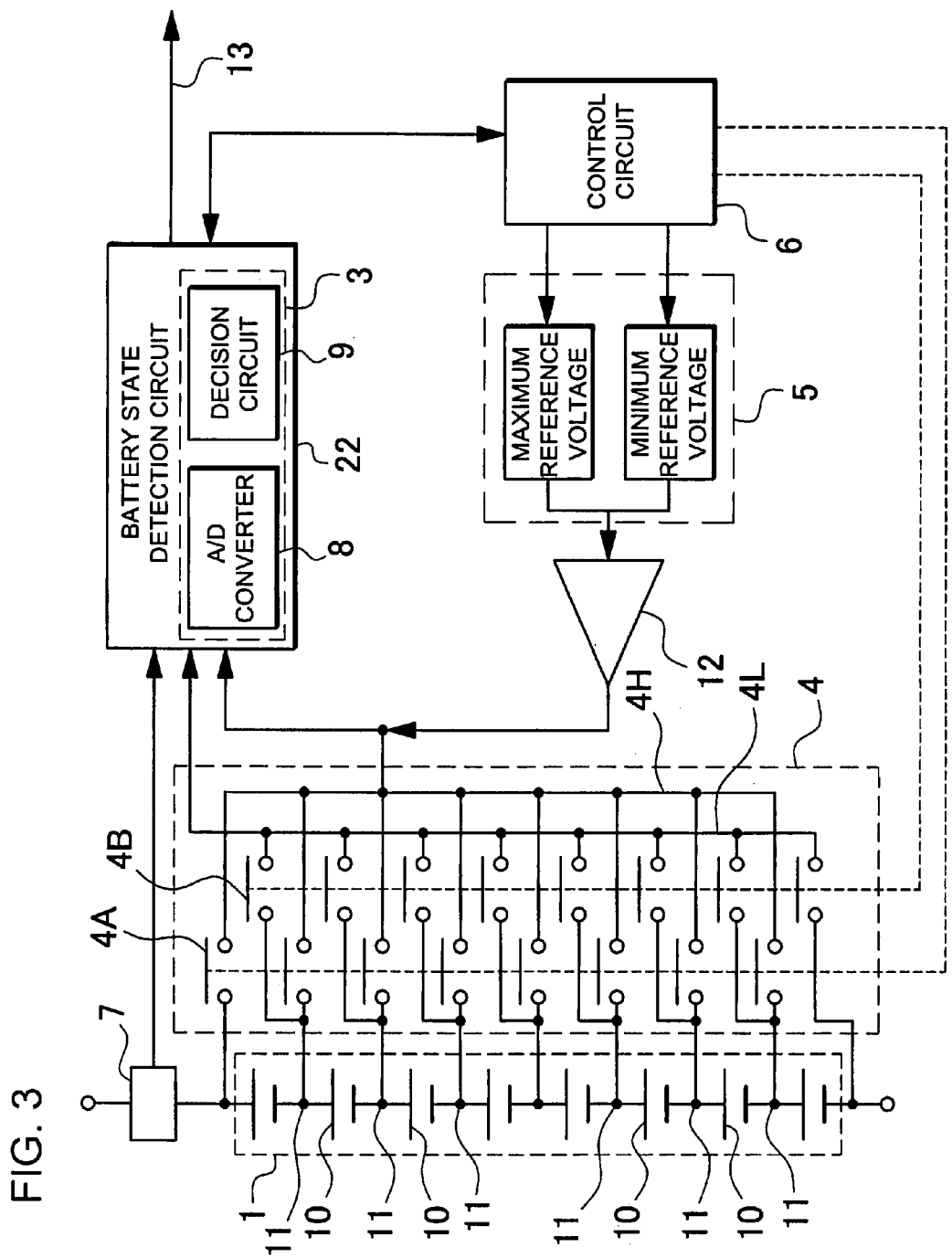
FIG. 3 is a block diagram of another embodiment of the car power source apparatus of the present invention.

In the car power source apparatus of the present invention, as shown in the block diagram of FIG. 3, the battery state detection circuit 22 can also be provided with an over-charge and over-discharge detection circuit 3. Further, proper operation of this over-charge and over-discharge detection circuit 3 can also be determined. In FIG. 3, structural elements that are the same as in the power source apparatus shown in FIG. 1 are indicated by the same part number and their detailed description is omitted. The battery state detection circuit 2 shown in FIG. 3 is provided with an over-charge and over-discharge detection circuit 3, and this over-charge and over-discharge detection circuit 3 detects battery unit 10 voltage, battery over-charge, and battery over-discharge, as well as computing quantities such as remaining battery capacity. In this power source apparatus as in the previously described power source apparatus, the control circuit 6 controls selection switches 4, the over-charge and over-discharge detection circuit 3, and the reference voltage circuit 5 to determine battery unit 10 over-charge and over-discharge via the over-charge and over-discharge detection circuit 3, and failure of the over-charge and over-discharge detection circuit 3. The control circuit 6 turns all selection switches 4 off, and the maximum reference voltage and minimum reference voltage are input in that order to the over-charge and over-discharge detection circuit 3 from the reference voltage circuit 5 to judge failure of the over-charge and over-discharge detection circuit 3. This power source apparatus can also determine over-charge and over-discharge detection circuit 3 failure while reliably judging over-charge and over-discharge of all battery units 10 with a simple circuit structure.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2006-305756 filed in Japan on Nov. 10, 2006, the content of which is incorporated herein by reference.

What is claimed is:

1. A car power source apparatus comprising:
 a battery array having a plurality of battery units connected in series via connection nodes;
 an over-charge and over-discharge detection circuit that detects over-charge and over-discharge conditions by measuring voltage of the plurality of battery units that make up said battery array;
 selection switches that sequentially input connection node voltages for each of the plurality of battery units to said over-charge and over-discharge detection circuit;
 a reference voltage circuit that inputs reference voltages to said over-charge and over-discharge detection circuit when said selection switches are not inputting connection node voltages; and
 a control circuit that controls said selection switches on and off and controls input of reference voltages from said reference voltage circuit to said over-charge and over-discharge detection circuit,
 wherein said control circuit controls said selection switches to input each connection node voltage of the plurality of battery units to said over-charge and over-discharge detection circuit to determine for each of the plurality of battery units over-charge and over-discharge conditions;
 said control circuit controls said selection switches to a state that does not input connection node voltages to said over-charge and over-discharge detection circuit;
 said control circuit controls the input of reference voltages from said reference voltage circuit to said over-charge and over-discharge detection circuit to confirm proper operation of said over-charge and over-discharge detection circuit; and
 the reference voltage is a maximum reference voltage greater than the over-charge voltage for detection of a battery unit over-charge condition or a minimum reference voltage less than the over-discharge voltage for detection of a battery unit over-discharge condition.

2. The car power source apparatus as recited in claim 1, further comprising a battery state detection circuit which is connected to an output-side of said selection switches.

3. The car power source apparatus as recited in claim 2 wherein said battery state detection circuit is a circuit that determines battery unit over-charge, over-discharge, and remaining capacity conditions.

4. The car power source apparatus as recited in claim 3 wherein said battery state detection circuit computes remaining capacity from battery array charging and discharging current.

5. The car power source apparatus as recited in claim 4 wherein said battery state detection circuit corrects the computed remaining capacity based on battery unit voltage.

6. The car power source apparatus as recited in claim 1 wherein said battery state detection circuit detects battery unit over-charge and over-discharge conditions with a fixed periodicity when the car is being driven; and it computes quantities such as remaining capacity, and sends these computed results to car-side systems via communication lines.

7. The car power source apparatus as recited in claim 2, wherein said over-charge and over-discharge detection circuit detects battery unit over-charge and over-discharge conditions in the event of failure of said battery state detection circuit.

8. The car power source apparatus as recited in claim 7 wherein said battery state detection circuit failure is determined from its output signals.

9. The car power source apparatus as recited in claim 8 wherein said battery state detection circuit is determined to be failing when no battery unit over-charge or over-discharge detection signal is output, and further, no remaining capacity signal is output.

10. The car power source apparatus as recited in claim 1 wherein a battery state detection circuit that determines battery unit over-charge, over-discharge, and remaining capacity is connected to an output-side of the selection switches, and said battery state detection circuit is provided with a over-charge and over-discharge detection circuit.

11. The car power source apparatus as recited in claim 1 wherein said over-charge and over-discharge detection circuit is provided with an A/D converter to convert signals input from said selection switches to digital signals, and a decision circuit to determine battery over-charge and over-discharge conditions from the signal output from the A/D converter.

12. The car power source apparatus as recited in claim 1 wherein a battery unit is a single rechargeable battery.

13. The car power source apparatus as recited in claim 12 wherein the rechargeable battery is a lithium ion rechargeable battery.

14. The car power source apparatus as recited in claim 1 wherein a battery unit is a plurality of rechargeable batteries connected in series.

15. The car power source apparatus as recited in claim 14 wherein the rechargeable battery is a nickel hydride battery.

\* \* \* \* \*